US012150240B2

(12) United States Patent
Rowlands et al.

(10) Patent No.: US 12,150,240 B2
(45) Date of Patent: Nov. 19, 2024

(54) BEND COMPENSATION FOR CONDUCTIVE TRACES ON PRINTED CIRCUIT BOARDS

(71) Applicant: Amphenol Corporation, Wallingford, CT (US)

(72) Inventors: Michael Rowlands, Milford, MA (US); Ali Hammoodi, Nashua, NH (US)

(73) Assignee: Amphenol Corporation, Wallingford, CT (US)

( * ) Notice: Subject to any disclaimer, the term of this patent is extended or adjusted under 35 U.S.C. 154(b) by 0 days.

(21) Appl. No.: 18/135,570

(22) Filed: Apr. 17, 2023

(65) Prior Publication Data

US 2023/0254966 A1    Aug. 10, 2023

Related U.S. Application Data

(62) Division of application No. 17/149,850, filed on Jan. 15, 2021, now Pat. No. 11,665,814.

(60) Provisional application No. 62/962,425, filed on Jan. 17, 2020.

(51) Int. Cl.
*H05K 1/02* (2006.01)
*H05K 1/11* (2006.01)

(52) U.S. Cl.
CPC ......... *H05K 1/0242* (2013.01); *H05K 1/0248* (2013.01); *H05K 1/025* (2013.01); *H05K 1/11* (2013.01)

(58) Field of Classification Search
CPC .............................................. H05K 1/024–025
See application file for complete search history.

(56) References Cited

U.S. PATENT DOCUMENTS

| 6,891,260 B1 | 5/2005 | Mora et al. |
| 7,453,143 B2 | 11/2008 | Dutta |
| 9,730,313 B2 | 8/2017 | Gailus et al. |
| 9,775,231 B2 | 9/2017 | Cartier, Jr. |
| 9,807,869 B2 | 10/2017 | Gailus et al. |

(Continued)

FOREIGN PATENT DOCUMENTS

| EP | 2953432 A1 | 12/2015 |
| JP | 2011-210760 A | 10/2011 |

(Continued)

OTHER PUBLICATIONS

International Preliminary Report on Patentability mailed Jul. 28, 2022 in connection with International Application No. PCT/US2021/013572.

(Continued)

*Primary Examiner* — Hoa C Nguyen
(74) *Attorney, Agent, or Firm* — Wolf, Greenfield & Sacks, P.C.

(57) ABSTRACT

A printed circuit board includes a dielectric substrate; first and second conductive traces disposed on the dielectric substrate; and a compensation structure disposed in the first conductive trace. The compensation structure includes a compensation segment connected in line with the first conductive trace; and a dielectric layer on all or part of the compensation segment. The first and second conductive traces may form a differential signal pair. The compensation segment may limit one or more of signal skew, mode conversion from differential mode to common mode, and impedance variations caused by a bend in the differential signal pair.

20 Claims, 11 Drawing Sheets

(56) References Cited

U.S. PATENT DOCUMENTS

| | | |
|---|---|---|
| 10,187,972 B2 | 1/2019 | Charbonneau et al. |
| 10,201,074 B2 | 2/2019 | Charbonneau et al. |
| 10,306,749 B1 | 5/2019 | Mutnury et al. |
| 10,356,893 B1* | 7/2019 | Toda .................. H05K 1/0245 |
| 10,375,823 B2 | 8/2019 | Staudt |
| 11,057,987 B2 | 7/2021 | Lou et al. |
| 11,665,814 B2 | 5/2023 | Rowlands et al. |
| 2006/0258187 A1 | 11/2006 | Behziz |
| 2010/0237961 A1 | 9/2010 | Pai et al. |
| 2015/0004748 A1 | 1/2015 | Shin et al. |
| 2015/0214596 A1 | 7/2015 | Kawai |
| 2017/0099728 A1* | 4/2017 | Janssen .................. H04B 3/30 |
| 2017/0264260 A1 | 9/2017 | Fukuchi |
| 2018/0279465 A1 | 9/2018 | Kogo et al. |
| 2019/0166687 A1 | 5/2019 | Chandra et al. |
| 2020/0267833 A1* | 8/2020 | Lou .......................... H01P 3/08 |
| 2020/0352025 A1* | 11/2020 | Vasa .................. H05K 1/0251 |
| 2020/0375025 A1* | 11/2020 | Kim .................... H05K 1/0245 |
| 2021/0227683 A1 | 7/2021 | Rowlands et al. |

FOREIGN PATENT DOCUMENTS

| | | |
|---|---|---|
| JP | 2020-005018 A | 1/2020 |
| TW | 200531608 A | 9/2005 |
| WO | WO 2016/196551 A1 | 12/2016 |

OTHER PUBLICATIONS

Taiwanese Office Action dated Jul. 3, 2024 in connection with Taiwanese Application No. 110101705.
Chinese Office Action dated Aug. 31, 2024 in connection with Chinese Application No. 202180014922.6.

* cited by examiner

BEND COMPENSATION FOR CONDUCTIVE TRACES ON PRINTED CIRCUIT BOARDS

CROSS REFERENCE TO RELATED APPLICATIONS

This application is a divisional of U.S. application Ser. No. 17/149,850, filed Jan. 15, 2021, which claims priority based on Provisional Application No. 62/962,425, filed Jan. 17, 2020, each of which is hereby incorporated by reference in its entirety.

TECHNICAL FIELD

This application relates generally to printed circuit boards, and more specifically to bend compensation for conductive traces that carry high frequency differential signals on printed circuit boards.

BACKGROUND

Printed circuit boards are typically used in electrical systems for mounting and interconnecting electrical components. A printed circuit board may include one or more dielectric substrates with electrically conductive signal traces and/or ground planes fabricated on the dielectric substrates. The dielectric substrates may be fiberglass epoxy resin, and the electrically conductive signal traces or ground planes may be a copper layer on the substrates, with patterns etched into the copper layer to form conductive traces.

The electrical components may include integrated circuit packages, discrete active and passive components, and/or electrical connectors for forming connections, such as with other printed circuit boards or with electrical cables. When mounted on the printed circuit board, contacts of the electrical components may be electrically coupled to the signal traces and/or to the ground planes. The contacts may be surface-mounted, press-fit into vias, or otherwise coupled to the conductive traces, which may take the form of pads with or without holes for receiving the contacts.

In some instances, a pair of conductive traces on a printed circuit board may carry differential signals. In contrast to common mode signals, which are referenced to ground, differential signals are referenced to one another. A circuit receiving the differential signal responds to the difference between the signals on the two traces, rather than to the difference between a single trace and ground.

In many applications, differential signals may be preferable over common mode signals due to better noise performance. External electromagnetic interference affects both conductors of the differential pair equally and is not detected. Since the receiving circuit detects only the difference between the conductors, the differential signaling technique is less affected by electromagnetic interference as compared to common mode signaling. Differential signals may be preferable in high speed, high frequency, and/or low power applications where electrical noise is a problem.

Ideally, the two signal traces of a differential signal pair are straight and parallel and have uniform surrounding material for optimum signal transmission. In practice, however, the differential signal traces have bends and have non-uniform surrounding material in order to meet design requirements of the PCB. Such deviations from the ideal configuration of differential signal traces may degrade performance, producing effects such as impedance variations, signal skew and/or mode conversion. These effects are more problematic at high operating frequencies in the GHz range.

Mode conversion occurs when signal energy is transferred from the differential mode to the common mode. For optimum operation of a differential signal pair, the two signal traces of the pair should have equal DC voltages. If the two signal traces have unequal DC voltages or the signals on the two signal traces are unequal, operation in the differential mode is at least partially converted to common mode operation. Signal skew occurs when the signal on one trace of the differential signal pair is delayed relative to the signal on the other trace of the differential signal pair. For example, when a pair of traces has a bend, the outer trace is longer than the inner trace. The signal traversing the shorter trace arrives at the receiving circuit before the signal traversing the longer trace. The signal skew may adversely affect operation of the receiving circuit. Impedance variations occur when the characteristics of the transmission line formed by the differential signal pair vary along the length of the transmission line. Such impedance variations can degrade transmission of signals on the differential signal pair.

It is known to compensate for signal skew on differential signal traces of different lengths by increasing the length of the shorter signal trace to provide equal mechanical lengths. The differential signals on the two traces then arrive at the receiving circuit at the same time. However, mechanical length adjustment, without more, may not compensate for mode conversion and impedance variations, particularly at high operating frequencies in the GHz range.

At high operating frequencies, additional factors may affect signal propagation on differential signal traces. For example, the dielectric material above and below each of the signal traces may be different and may vary along the lengths of the signal traces. Furthermore, the widths of the signal traces may be different from each other and the widths and spacing of the signal traces may vary along the lengths of the signal traces. These factors may cause the wave speeds of signals on the two traces to be different from each other and the impedance to vary. Such effects are more problematic at high operating frequencies in the GHz range.

Accordingly, there is a need for printed circuit board configurations that overcome or mitigate one or more of these effects, including but not limited to signal skew, mode conversion, and impedance variation.

SUMMARY

The inventors have discovered that undesired effects on signal transmission of bends in differential signal traces on printed circuit boards can be compensated by providing a compensation structure in at least one signal trace of a differential signal pair. The compensation structure is connected in series with the signal trace. In some embodiments, the compensation structure includes a compensation segment having a width that is different from the width of the signal traces outside the compensation structure. In some embodiments, the compensation structure includes a curved portion, such as a circular portion. The compensation structure may also include a dielectric layer covering all or part of the compensation segment. The dielectric layer may comprise a soldermask layer. In addition to bends in the differential signal traces, the compensation structure may compensate for one or more other printed circuit board configurations that can degrade signal transmission, including but not limited to dielectric materials in proximity to the differential signal traces, conductive materials in proximity to the differential signal traces and/or electrical components in proximity to the differential signal traces.

The compensation segment may be wider than a corresponding segment of the other trace. The compensation segment may have increased or decreased spacing from the corresponding segment of the other trace as compared with the spacing between the first and second conductive traces outside the compensation structure. The width of the compensation segment in the compensation structure may be configured to limit signal skew in the differential signal pair. The length of the compensation segment in the compensation structure may be configured to limit mode conversion in the differential signal pair. The dielectric layer on the compensation segment may be configured to control impedance. The compensation structure may therefore be configured to limit one or more of signal skew, mode conversion and impedance variation of the differential signal pair.

The compensation structure may be located at or near a bend in the signal traces, but is not necessarily located at or near a bend. A differential signal pair may include one or more compensation structures along its length. For example, if the differential signal pair includes more than one bend, a compensation structure may be located at or near each bend. Compensation structures may be located on one or both signal traces of the differential signal pair. The features of the compensation structure may be utilized separately or in combination. In some embodiments, the compensation structure includes a compensation segment of increased width and increased spacing from the other signal trace of the differential signal pair, and further includes a soldermask layer covering the compensation segment.

In accordance with embodiments, a printed circuit board comprises a dielectric substrate; first and second conductive traces disposed on the dielectric substrate; and a compensation structure disposed in the first conductive trace, the compensation structure including: a conductive compensation segment connected in line with the first conductive trace; and a dielectric layer on all or part of the compensation segment.

In some embodiments, a width of the compensation segment is different from a width of a corresponding segment of the second conductive trace.

In some embodiments, the first and second conductive traces are parallel and include at least one bend.

In some embodiments, the compensation structure is located at or near the bend in the first and second conductive traces.

In some embodiments, a spacing between the compensation segment and the second conductive trace is greater than a spacing between the first and second conductive traces outside the compensation structure.

In some embodiments, the dielectric layer comprises a soldermask layer.

In some embodiments, the compensation segment has a length that is configured to limit mode conversion of a differential signal propagating on the first and second conductive traces.

In some embodiments, the compensation structure is configured to limit mode conversion of a differential signal propagating on the first and second conductive traces.

In some embodiments, the printed circuit board further comprises a first electrical component disposed on the dielectric substrate and connected to first ends of the first and second conductive traces and a second electrical component disposed on the dielectric substrate and connected to second ends of the first and second conductive traces.

In some embodiments, the compensation structure further comprises a first connecting segment between one end of the compensation segment and the first conductive trace and a second connecting segment between the other end of the compensation segment and the first conductive trace.

In some embodiments, the compensation structure includes first and second compensation structures located on opposite sides of a bend in the first and second conductive traces.

In some embodiments, the compensation structure is configured to equalize electrical lengths of the first and second conductive traces.

In some embodiments, the dielectric layer comprises a patch of dielectric material that covers at least a portion of the compensation segment.

In some embodiments, a corresponding segment of the second conductive trace is not covered by the dielectric layer.

In some embodiments, the width of the compensation segment is in a range of 1 to 3 times a width of the first conductive trace outside the compensation structure.

In some embodiments, a spacing between the compensation segment and the second conductive trace is in a range of 1 to 5 times a spacing between the first and second conductive traces outside the compensation structure.

In some embodiments, the dielectric layer has a dielectric constant of 3 or greater.

In some embodiments, the compensation is rectangular and, together with the first and second connecting segments, forms a jogout structure.

In accordance with embodiments, a printed circuit board comprises a dielectric substrate; first and second electrical components mounted on the dielectric substrate; first and second conductive traces disposed on the dielectric substrate and connected between the first and second electrical components, the first and second conductive traces including at least one bend, the first and second conductive traces forming a differential signal pair; and a compensation structure disposed in the first conductive trace, the control structure including: a compensation segment connected in line with the first conductive trace, the compensation segment having a width different from a width of a corresponding segment of the second conductive trace; and a dielectric layer on all or part of the compensation segment.

In accordance with embodiments, a method for fabricating a printed circuit board comprises forming a conductive layer on a dielectric substrate; patterning the conductive layer to form first and second conductive traces of a differential signal pair, at least one of the first and second conductive traces including a compensation segment of a compensation structure; applying a dielectric material over the patterned conductive layer, and patterning the dielectric material to form a dielectric layer on all or part of the compensation segment to form the compensation structure.

In accordance with embodiments, a method is provided for compensating for a bend in first and second conductive traces of a differential signal pair on a printed circuit board, comprising: determining a location of a compensation structure in at least one of the first and second conductive traces; determining a width of a compensation segment of the compensation structure to achieve matched electrical lengths of the first and second conductive traces; selecting a length of the compensation segment of the compensation structure to limit mode conversion of a differential signal on the first and second conductive traces; and configuring a dielectric layer covering all or part of the compensation segment of the compensation structure to achieve a target impedance.

In accordance with embodiments, a printed circuit board comprises a dielectric substrate; first and second conductive traces disposed on the dielectric substrate; and a compensation structure disposed in the first conductive trace, the compensation structure including: a conductive compensation segment connected in line with the first conductive trace, the compensation segment including a curved portion.

In some embodiments, the curved portion of the compensation segment comprises a circular portion.

In some embodiments, a radius of curvature of the circular portion is larger than half a width of the first conductive trace.

In some embodiments, the compensation segment includes a V-shaped portion opposite the curved portion.

In some embodiments, the compensation structure further comprises a first connecting segment between one end of the compensation segment and the first conductive trace and a second connecting segment between the other end of the compensation segment and the first conductive trace.

In some embodiments, the compensation structure further comprises first and second circular conductive areas located adjacent to the first and second conductive traces, respectively.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
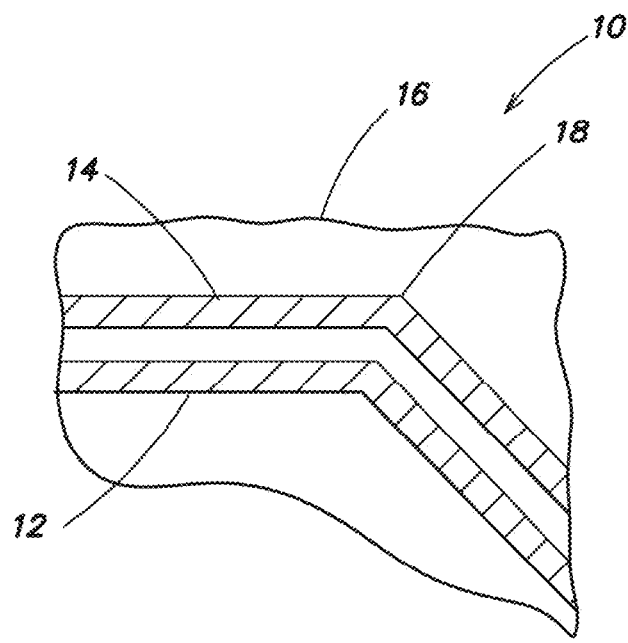
FIG. 1 is a top view of a conventional printed circuit board with differential signal traces having a bend.

The inventors have developed structures and methods for compensating for undesired effects in conductive traces on a printed circuit board. The printed circuit board may include a dielectric substrate and first and second conductive traces formed on the dielectric substrate. The first and second conductive traces may serve as a differential signal pair for carrying a differential signal. As used herein, the terms "differential signal pair" and "differential signal traces" refer to two conductive lines on a printed circuit board that are spaced apart and parallel, and which form a transmission line for carrying a differential signal. It should be noted that the compensation structures disclosed herein may cause the first and second conductive traces to deviate from a parallel configuration.

The first and second conductive traces may include a bend. The bend causes undesired electrical effects with respect to signals propagating on the first and second conductive traces, particularly at high frequencies. The bend causes one of the conductive traces to be longer than the other, thus resulting in signal skew. Furthermore, the bend may produce undesired impedance variations and mode conversion from differential mode to common mode.

In embodiments, a compensation structure is disposed in at least one of the conductive traces. If the first and second conductive traces have a bend, the compensation structure may be disposed in the conductive trace that is shorter due to the bend. The compensation structure may be configured to compensate for undesired electrical effects of the bend. Assuming that the first conductive trace is the shorter conductive trace, the compensation structure may include a compensation segment connected in line with the first conductive trace and a dielectric layer covering all or part of the compensation segment. In some embodiments, the compensation segment has a width different from a width of a corresponding segment of the second conductive trace. In some embodiments, the compensation segment includes a curved portion, such as a circular portion.

The compensation segment of the compensation structure is connected at each end to the first conductive trace to form a so-called jogout structure. The jogout structure effectively increases the mechanical length of the first conductive trace relative to the second conductive trace. In embodiments, the jogout structure may be dimensioned to mismatch, rather than to match, the mechanical lengths of the first and second conductive traces. The mismatch in mechanical lengths together with other features of the compensation structure, as described herein, may match the electrical lengths of the first and second conductive traces.

The dielectric layer, typically a soldermask layer, may cover all or part of the compensation segment of the compensation structure. The dielectric layer affects the impedance of the transmission line formed by the first and second conductive traces and, together with the width of the compensation segment of the compensation structure, enables impedance tuning. Furthermore, it has been discovered that mode conversion from differential mode to common mode is a function of the length of the compensation segment of the compensation structure. The length of the compensation segment can be selected to limit mode conversion. As such, the compensation structure may be configured to limit one or more of signal skew, mode conversion and impedance variation of the differential signal pair.

A printed circuit board 10 having a conventional differential signal pair is shown in FIG. 1. FIG. 1 is a top view of the printed circuit board. A first conductive trace 12 and a second conductive trace 14 are formed on a dielectric substrate 16. The first and second conductive traces 12 and 14 are generally parallel and include a bend 18 which causes the mechanical lengths of traces 12 and 14 to be mismatched. As discussed above, the bend 18 may cause signal skew between signals propagating on the first and second conductive traces 12 and 14, may cause impedance variations and may cause mode conversion from differential mode to common mode. These effects are more problematic at high operating frequencies in the GHz range.

Figure 2:
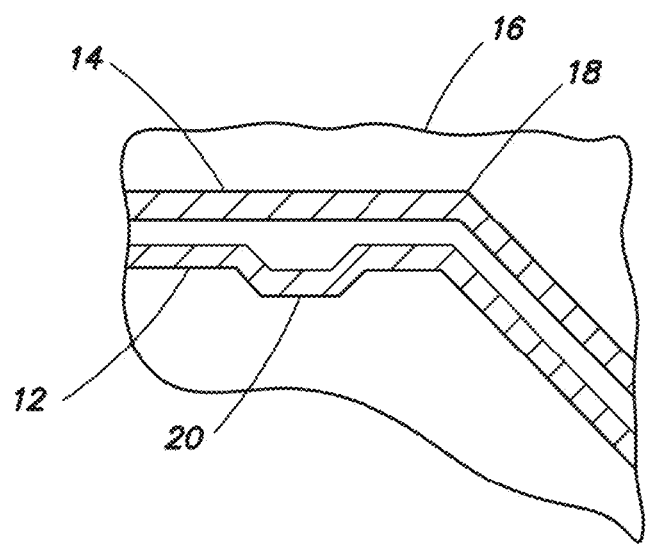
FIG. 2 is a top view of a conventional printed circuit board with differential signal traces having length compensation.

A conventional approach to compensate for the mismatched length of first conductive trace 12 and second conductive trace 14 is shown in FIG. 2. A jogout structure 20 is added to the first conductive trace 12, which is shorter than the second conductive trace 14 as a result of bend 18. The width of the first conductive trace 12 in the jogout structure 20 is the same as the width of the first conductive trace outside the jogout structure. The jogout structure 20 increases the length of first conductive trace 12 such that the mechanical lengths of the two conductive traces are matched. The conventional approach may not be effective at high operating frequencies in the GHz range.

Figure 3:
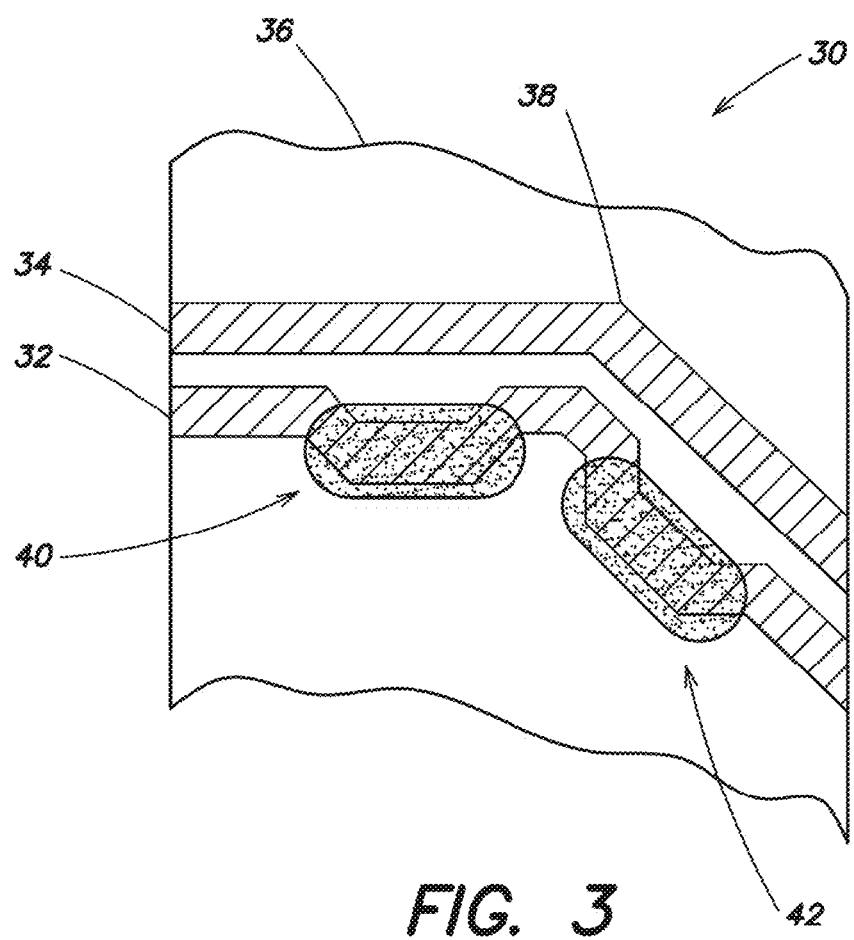
FIG. 3 is a top view of a printed circuit board having differential signal traces with compensation structures, in accordance with embodiments.

A printed circuit board in accordance with embodiments is shown in FIG. 3. A printed circuit board 30 includes a first conductive trace 32 and a second conductive trace 34 formed on a surface of a dielectric substrate 36. The first and second conductive traces 32 and 34 may be a metal, such as copper. In some embodiments, the first and second conductive traces 32 and 34 have equal widths and equal thicknesses and are separated by a spacing equal to the width of one of the traces. However, these are not requirements and the widths, thicknesses and spacing may be different. The first and second conductive traces 32 and 34 are connected at opposite ends to electrical components (see FIG. 7) mounted on the printed circuit board. The first and second conductive traces 32 and 34 form a transmission line for carrying differential signals between the electrical components.

The printed circuit board may include a single dielectric substrate with conductive traces formed thereon or may include two or more substrates, each having conductive traces and/or ground planes formed thereon. The two or more substrates and associated conductive layers are pressed together to form the printed circuit board.

The first and second conductive traces 32 and 34 each include a bend 38 which may be required by design constraints of the printed circuit board 30. The bend 38 may be an abrupt change of direction, as shown in FIG. 3, or may be a curve of any shape that causes a deviation from straight conductive traces. Furthermore, the first and second conductive traces 32 and 34 may include any number of bends, and the bends may be in the same or different directions and may have the same or different angles.

The printed circuit board 30 further includes at least one compensation structure. The embodiment of FIG. 3 includes a compensation structure 40 and a compensation structure 42. Each of the compensation structures 40 and 42 is connected in line with, that is electrically in series with, the first conductive trace 32. The compensation structure 40 has opposite ends connected to first conductive trace 32, and compensation structure 42 has opposite ends connected to first conductive trace 32 to form a continuous electrical path from first conductive trace 32 through compensation structures 40 and 42. In the embodiment of FIG. 3, the first conductive trace 32 is mechanically shorter than the second conductive trace 34, in the absence of compensation structures 40 and 42, as a result of bend 38.

In the embodiment of FIG. 3, the compensation structures 40 and 42 are located close to bend 38 and are located on opposite sides of bend 38. However, this is not a requirement. The printed circuit board 30 may include a single compensation structure in first conductive trace 32 or may include more than two compensation structures in conductive trace 32. The compensation structures may be located at or near bend 38, but this is not a requirement. In particular, the compensation structures may be located at any point along the length of the first conductive trace 32. Furthermore, the printed circuit board may include compensation structures in the first conductive trace 32 and/or the second conductive trace 34 in any number required to achieve a desired electrical performance. For example, one or more compensation structures may be provided for each bend in the first and second conductive traces 32 and 34. The compensation structures may have the same or different mechanical and electrical parameters depending on the required compensation at a particular location along the conductive traces.

Figure 4:
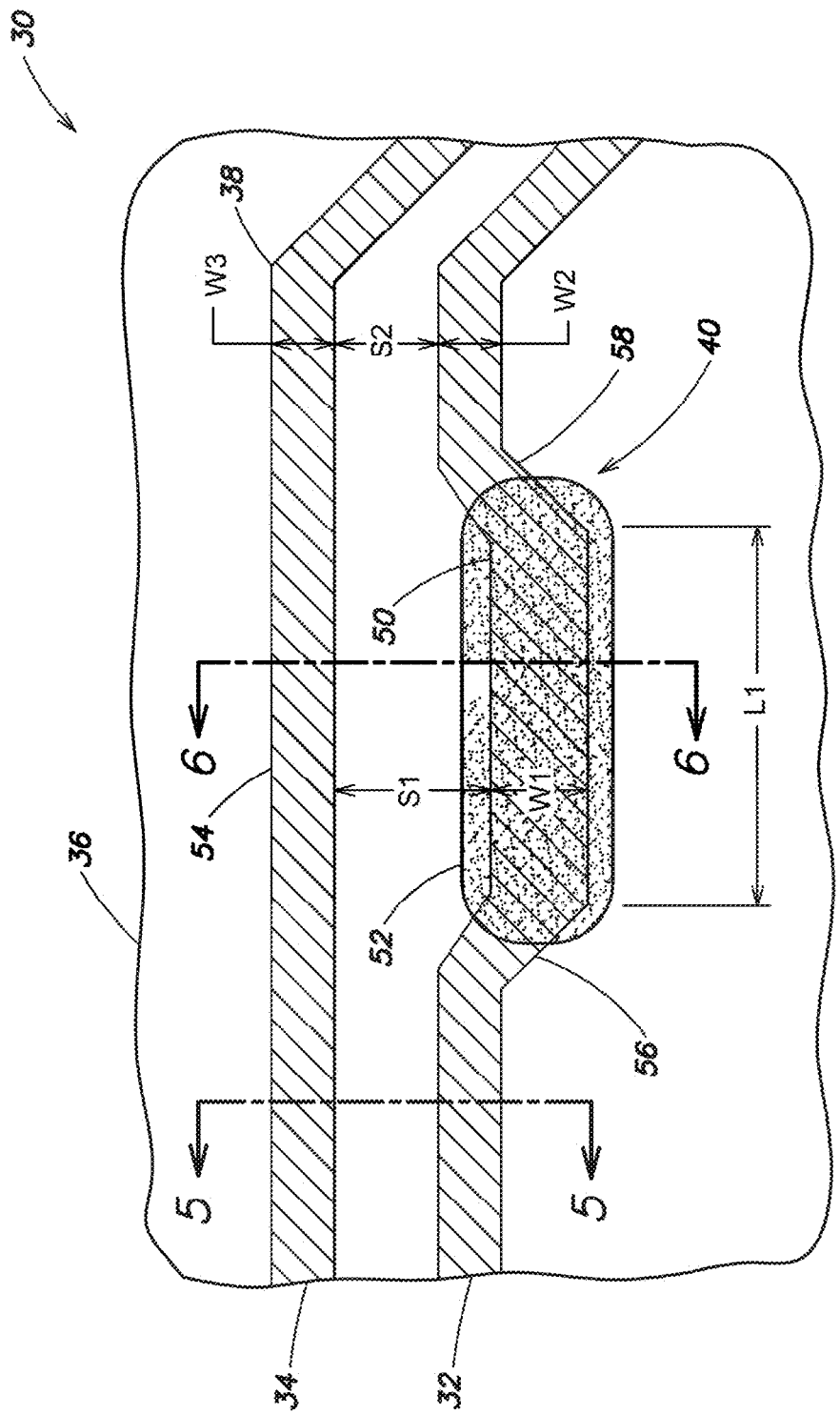
FIG. 4 is an enlarged top view of a printed circuit board showing a detail of a compensation structure, in accordance with embodiments.
Figure 5:
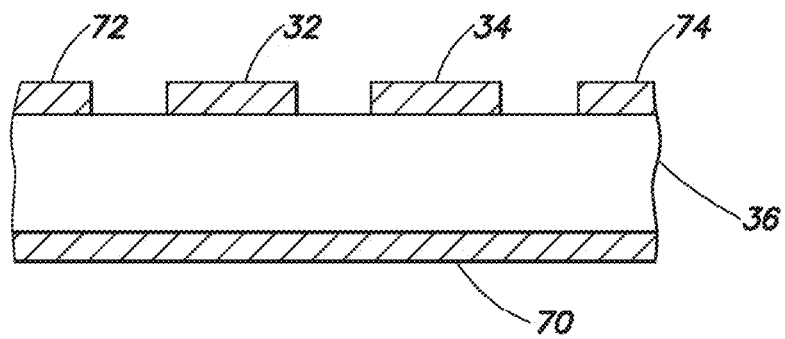
FIG. 5 is a cross-sectional view of the printed circuit board of FIG. 4 taken along the line 5-5.
Figure 6:
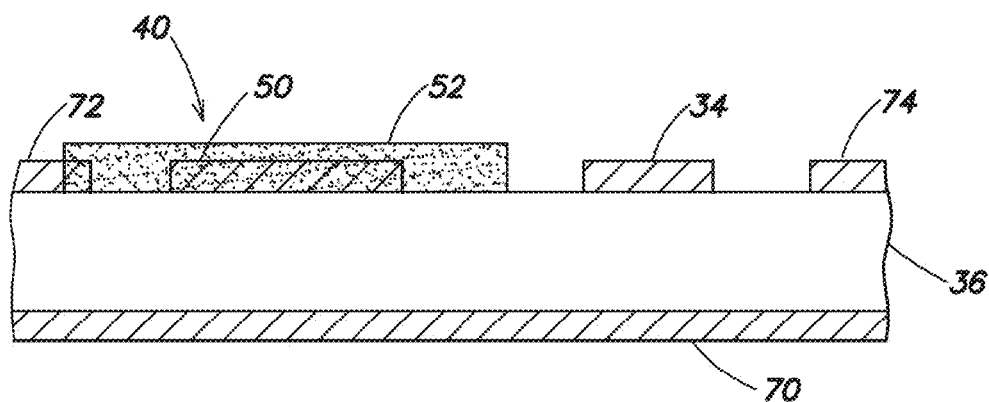
FIG. 6 is a cross-sectional view of the printed circuit board of FIG. 4 taken along the line 6-6.

An enlarged schematic diagram of printed circuit board 30 including compensation structure 40 in accordance with embodiments is shown in FIGS. 4-6. FIG. 4 is a top view of printed circuit board 30 including compensation structure 40, and FIGS. 5 and 6 are cross-sectional views of printed circuit board 30, taken along the lines 5-5 and 6-6, respectively, in FIG. 4.

The compensation structure 40 is connected in line with first conductive trace 32 and in particular is electrically connected in series with first conductive trace 32 to form a continuous electrical path including first conductive trace 32 and compensation structure 40. The compensation structure 40 includes a compensation segment 50, connecting segments 56 and 58, and a dielectric layer 52 that covers all or part of compensation segment 50. The compensation segment 50 is formed of conductive material and is typically formed of the same material as the first and second conductive traces 32 and 34. In the embodiment of FIG. 4, compensation segment 50 is rectangular in shape, but this is not a requirement.

The dielectric layer 52 may be a soldermask layer, as used in printed circuit board fabrication, but is not limited to a soldermask layer. Soldermask, a thin layer of polymer, is applied to the conductive traces in conventional printed circuit board fabrication to protect against oxidation and to prevent short circuits between conductive traces. Soldermask is typically applied to the printed circuit board before mounting electrical components to prevent short-circuiting when mounting the electrical components to the printed circuit board. For example, solder used to connect the components to conductive traces or to a ground plane may inadvertently contact other traces or a ground plane.

As shown in the embodiment of FIG. 4, the compensation segment 50 may be rectangular in shape having a width W1 and a length L1. The conductive trace 32 has a width W2 and the conductive trace 34 has a width W3. The widths W2 and W3 of conductive traces 32 and 34 may be equal, and the width W1 of compensation segment 50 may be greater than the widths of conductive traces 32 and 34. The increased width of compensation segment 50 relative to conductive trace 32 provides increased wave speed of a signal propagating on conductive trace 32. As a result, the signal propagating on conductive trace 32 speeds up relative to the signal on conductive trace 34, thereby compensating, at least partially, for the difference in mechanical lengths of conductive traces 32 and 34.

In some embodiments, the width W1 of compensation segment 50 may be in a range of 1 to 3 times the width W2 of first conductive trace 32. The length L1 of compensation segment 50 may be selected to limit mode conversion from the differential mode to the common mode. The compensation segment 50 may be spaced from the second conductive trace 34 by a spacing S1 which is greater than a spacing S2 between first conductive trace 32 and second conductive trace 34. The spacing S1 may be in a range of 1 to 5 times the spacing S2.

The compensation structure 40 includes connecting segment 56 that connects one end of compensation segment 50 to first conductive trace 32 and connecting segment 58 that connects an opposite end of compensation segment 50 to first conductive trace 32 to form a continuous electrical path from first conductive trace 32 through compensation segment 50. The connecting segments 56 and 58 may be tapered from the width of first conductive trace 32 to the width of compensation segment 50. The connecting segments 56 and 58 can have any desired shape, but preferably avoid abrupt changes, such as right angles, which may adversely affect the high frequency transmission characteristics of the transmission line formed by first conductive trace 32 and second conductive trace 34.

The compensation segment 50 and the connecting segments 56 and 58 form a so-called "jogout" structure in first conductive trace 32. The jogout structure effectively increases the mechanical length of the first conductive trace 32. In accordance with embodiments, the jogout structure formed by compensation segment 50 and connecting segments 56 and 58 may produce a mismatch in mechanical length between first conductive trace 32 and second conductive trace 34, rather than equalizing the mechanical lengths. The mismatch in mechanical lengths may be offset by the increased width of compensation segment 50 and by the dielectric layer 52.

A corresponding segment 54 of second conductive trace 34 is located opposite compensation structure 40. In the embodiment of FIG. 4, the corresponding segment 54 has the same width as the remainder of second conductive trace 34 and is not covered with a dielectric layer. In other embodiments, the corresponding segment 54 may have a different width from the second conductive trace 34 and may be covered by a dielectric layer, in effect providing a compensation structure in second conductive trace 34. In such embodiments, the compensation structure in second conductive trace 34 may have different parameters from the compensation structure 40 to achieve a desired performance.

In the embodiment of FIG. 4, the dielectric layer 52 covers compensation segment 50 and overlaps the edges of compensation segment 50, such that portions of the dielectric substrate 36 and portions of connecting segments 56 and 58 are covered. Furthermore, the dielectric layer 52 has an oval shape in the embodiment of FIG. 4. However, these are not requirements, and the dielectric layer 52 may cover all or only a part of compensation segment 50 and may or may not overlap the edges of compensation segment 50. The size, shape, thickness and location of dielectric layer 52 are selected to produce a desired effect on the impedance of the transmission line so as to compensate for the effect of the bend 38 on the impedance of the transmission line. For example, the dielectric layer 52 can be rectangular, circular or irregularly shaped, depending on the size and shape of the compensation segment 50.

As shown in FIGS. 5 and 6, the dielectric substrate 36 may have a conductive layer 70 formed on its back surface. The conductive layer 70 may, for example, be a ground plane or a ground conductor. Furthermore, the printed circuit board 30 may include conductive traces 72 and 74 (shown in FIGS. 5 and 6 but not shown in FIG. 4) adjacent to conductive traces 32 and 34, respectively. In the region of compensation structure 40, the conductive trace 72 is adjacent to compensation segment 50. The conductive traces 72 and 74 may be signal lines, power supply lines or ground lines, for example.

In the embodiment of FIG. 4, the compensation segment 50 has a width W1 that is greater than the width W2 of first conductive trace 32 and the width W3 of second conductive trace 34. However, this is not a requirement. In some embodiments, the width W1 of compensation segment 50 may be equal to or less than the width W2 of first conductive trace 32 and the width W3 of second conductive trace 34. Furthermore, in the embodiment of FIG. 4, the spacing S1 between compensation segment 50 and corresponding segment 54 is greater than the spacing S2 between first conductive trace 32 and second conductive trace 34 outside compensation structure 40. However, this is not a requirement. In some embodiments, the spacing S1 between compensation segment 50 and corresponding segment 54 may be equal to or less than the spacing S2 between first conductive trace 32 and second conductive trace 34 outside the compensation structure 40.

In one non-limiting example, the first conductive trace 32 and the second conductive trace 34 are configured to carry a differential signal, and the bend 38 has an angle of 45 degrees. In this example, the first conductive trace 32 has a width W2 of 10 mils, the second conductive trace 34 has a width W3 of 10 mils, and the spacing S2 between first conductive trace 32 and second conductive trace 34 is 5 mils. Furthermore, in this example, the compensation segment 50 has a width W1 of 15 mils, a length L1 of 30 mils and a spacing S1 of 10 mils from corresponding segment 54. The dielectric layer 52 is formed of soldermask having a thickness of 1 mil and covers all of the compensation segment 50. The dielectric layer 52 in this example has a dielectric constant of 4.5. It will be understood that this example is not limiting as to the scope of the present technology.

Figure 7:
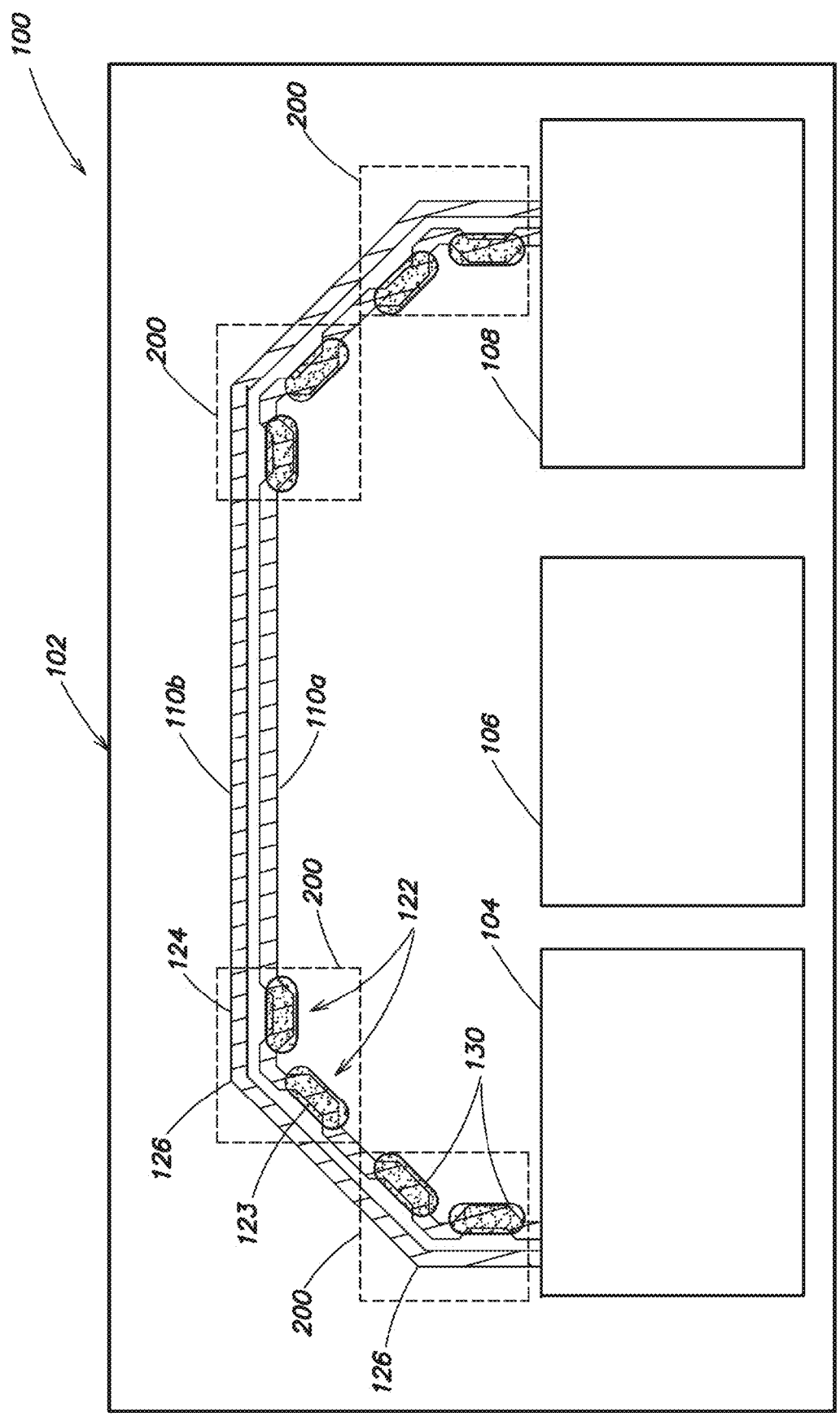
FIG. 7 is a top view of a printed circuit board in accordance with embodiments.

FIG. 7 is a top view of a printed circuit board 100 in accordance with embodiments. In the embodiment of FIG. 7, printed circuit board 100 includes a substrate 102 having electrical components 104, 106, and 108 mounted thereon, and conductive traces 110a and 110b routed from component 104 to component 108. Each of components 104, 106, and 108 may be an integrated circuit, an electrical connector, a passive or active component such as a resistor, capacitor, inductor, diode, or transistor, or other suitable electrical component. Conductive traces 110a and 110b may be configured to carry differential signals between component 104 and component 108.

In some embodiments, substrate 102 may be formed of fiberglass epoxy resin, and conductive traces 110a and 110b may be formed of a copper layer bonded to substrate 102. The conductive traces 110a and 110b may be formed by patterning of the copper layer using known lithographic techniques.

In FIG. 7, conductive traces 110a and 110b are not straight lines from component 104 to 108. Instead, conductive traces 110a and 110b bend in several locations between component 104 and component 108. Bends in the conductive traces may be required, for example, based on the locations of the components 104 and 108 on the printed circuit board 100, the locations of other components on the printed circuit board 100, and/or the locations of other conductive traces on the printed circuit board 100.

In the embodiment of FIG. 7, compensation structures 122 are located in compensation regions 200 at the bends in conductive traces 110a and 110b. Within compensation regions 200, conductive traces 110a and 110b have bends 126 that transition from a first direction to a second direction. In the embodiment of FIG. 7, the second direction of each bend of conductive traces 110a and 110b is at an angle of approximately 45 degrees relative to the first direction. However, in accordance with embodiments, the angles of different bends may be the same or different and may have any required value that is compatible with printed circuit board design. For example, the angle may be 10 degrees, 30 degrees, 45 degrees, 90 degrees, or another suitable angle. Further, it should be appreciated that compensation regions 200 may be located elsewhere on printed circuit board 100 than at bending locations. In some embodiments, compensation regions 200 may be located at or near bending locations of traces 110a and 110b.

As described herein, the inventors recognized that mechanical length compensation techniques do not provide adequate electrical performance at high frequencies. Accordingly, in the embodiment of FIG. 7, conductive trace 110a includes compensation structures 122 within each compensation region 200. In particular, conductive trace 110a includes one or more compensation structures 122 and corresponding portions 124 of trace 110b do not include compensation structures. As a result, the electrical parameters of the conductive traces 110a and 110b are different at the location of each compensation structure 122. The different electrical parameters provide a desired performance of the differential signal pair. Each compensation structure 122 includes a compensation segment 123 and a dielectric layer 130 that covers all or part of compensation segment 123.

In some embodiments, dielectric layer 130 may include soldermask or other dielectric material. Preferably, dielectric layer 130 has a dielectric constant greater than 1.5, such as approximately 2-3, 3-4, or 4-5, and has a thickness in a range of 1 to 5 mils. In some embodiments, the corresponding portion 124 of trace 110b is not covered with a dielectric layer. In other embodiments, the corresponding portion 124 of trace 110b may be covered by a dielectric material other than air, such as a dielectric material having a lower dielectric constant than dielectric layer 130.

In some embodiments, compensation regions 200 of printed circuit board 100 may all be substantially identical. Alternatively, some of compensation regions 200 may be configured differently from one another. In accordance with embodiments, one or both of conductive traces 110a and 110b may include one or more compensation structures 122.

Figure 8:
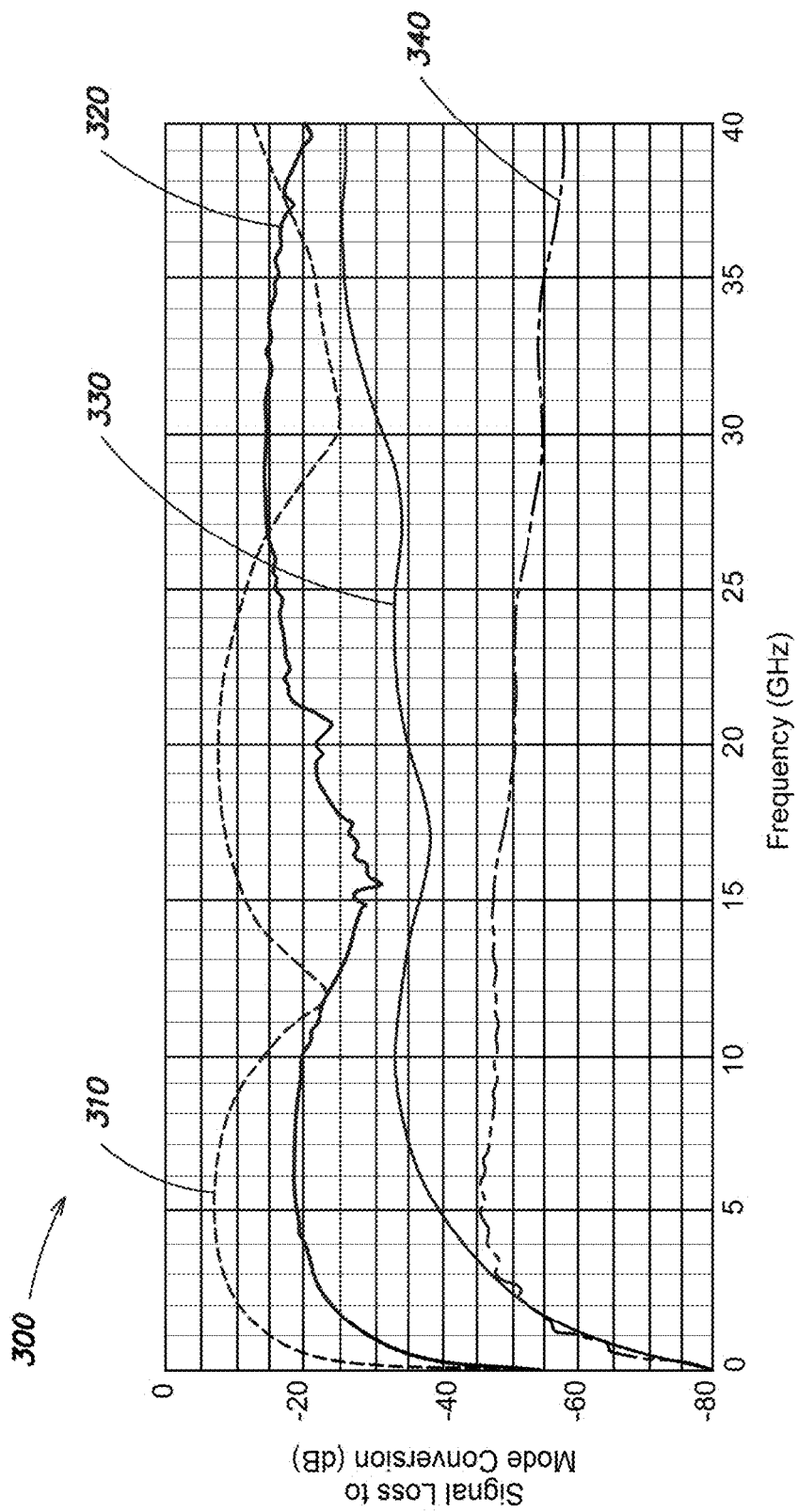
FIG. 8 is a graph comparing simulation results for various differential signal pair configurations.

FIG. 8 is a graph 300 comparing simulation results for various differential signal trace configurations. In FIG. 8, signal loss in dB due to mode conversion of the differential signal pair is plotted as a function of operating frequency in GHz. The simulation tool used was an Ansys High Frequency Structure Simulator.

The simulation was based on a printed circuit board structure including an 11 mils thick dielectric substrate and a microstrip structure. The dielectric constant of the substrate was 3.25 in this simulation. The microstrip differential signal traces were each 10 mils wide, with a 5 mils gap between signal traces, and a 5 mils gap to coplanar ground on both sides of the structure. The signal traces went through two 45-degree bends to implement a right-angle change in direction, as shown in FIG. 7. Referring to FIG. 4, the connecting segment 56 had a length of 12 mils, the compensation segment 50 had a length of 10 mils, and the connecting segment 58 had a length of 12 mils. The connecting segments 56 and 58 were oriented at 45 degrees to the trace 32. The 10 mil compensation segment 50 was coated with soldermask 52 to slow down the fields on that side of the differential pair. The soldermask dielectric constant was 4.5. The width W1 of the 10 mil compensation segment 50 can be the same, narrower or wider than the trace 32, in order to tune impedance.

In FIG. 8, curve 310 represents a printed circuit board where two parallel conductive traces have a bend and no bend compensation is provided, as shown in FIG. 1. In this case, one trace is mechanically longer than the other and no attempt is made to compensate for the difference in mechanical length.

Curve 320 represents a printed circuit board where two parallel conductive traces have a bend and conventional mechanical length compensation is provided, as shown in FIG. 2. In this case, the traces are as close as possible to having equal mechanical lengths, such as by making the shorter of the two traces mechanically longer to compensate for the difference in mechanical length caused by the bend.

Curve 330 represents a printed circuit board where two parallel conductive traces have a bend, and bend compensation is provided, as shown in FIGS. 3-7 and described herein.

Curve 340 represents a printed circuit board where two parallel conductive traces have no bend, so as to indicate a minimum level of mode conversion. The signal loss due to mode conversion of curve 340 is below −40 dB for all plotted frequencies.

As shown in FIG. 8, signal loss to mode conversion using bend compensation as described herein (curve 330) is reduced as compared with no compensation (curve 310) and with conventional mechanical length compensation (curve 320), at frequencies up to 40 GHz. In particular, the bend compensation described herein shows a 20 dB improvement as compared with no compensation and a 10 dB improvement over conventional mechanical length compensation.

Figure 9:
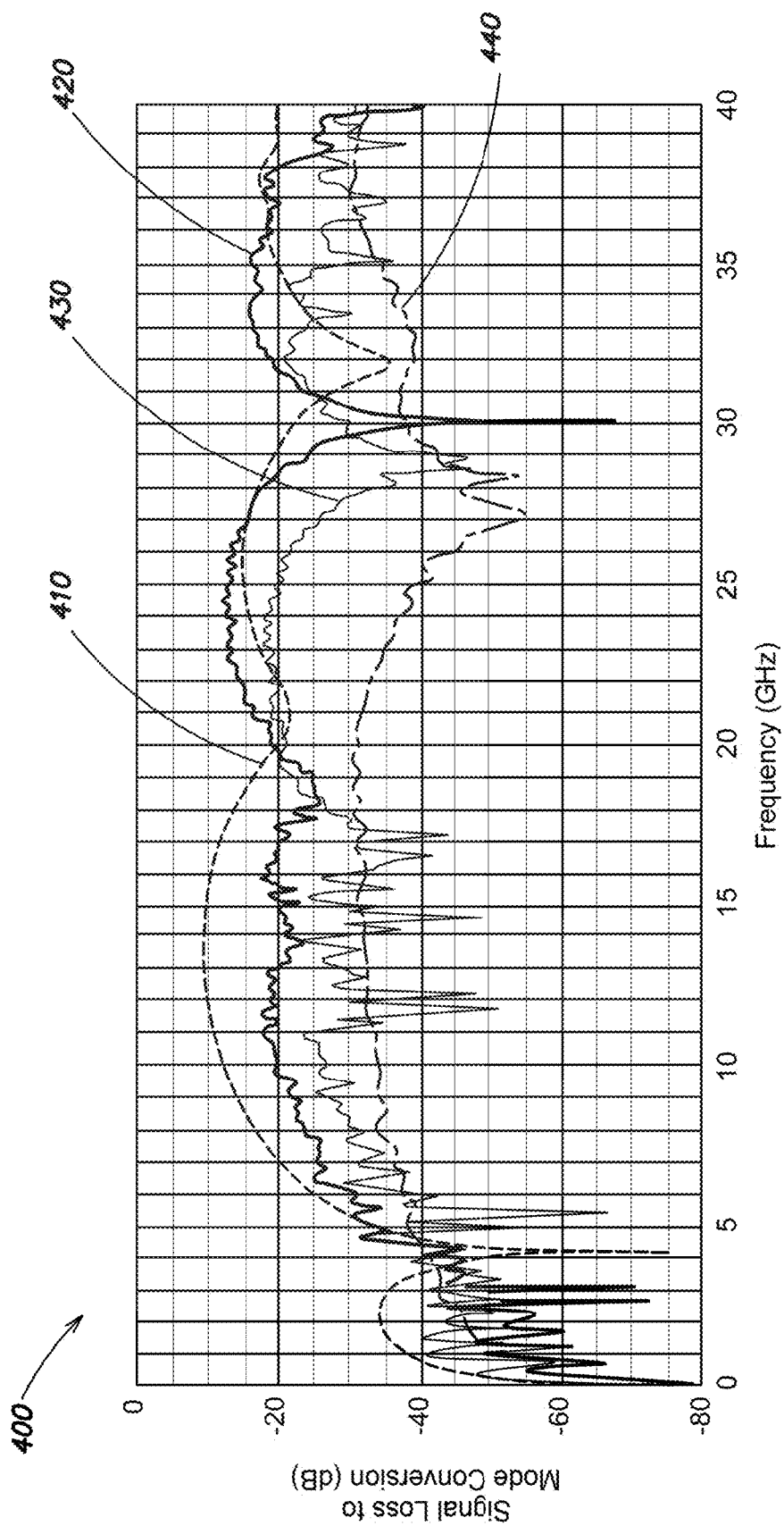
FIG. 9 is a graph comparing measurement results for various differential signal pair configurations.

FIG. 9 is a graph 400 comparing measurement results for various differential signal trace configurations. Signal loss in dB due to mode conversion of the differential signal pair is plotted as a function of operating frequency in GHz. The printed circuit board structure used for obtaining the measurement results shown in FIG. 9 was the same as the printed circuit board structure used for obtaining the simulation results of FIG. 8. The measurement results may be obtained using conventional high frequency measurement techniques.

Curve 410 represents a printed circuit board where two parallel conductive traces have a bend and no bend compensation is provided, as shown in FIG. 1.

Curve 420 represents a printed circuit board where two parallel conductive traces have a bend and conventional mechanical length compensation is provided, as shown in FIG. 2.

Curve 430 represents a printed circuit board where two parallel conductive traces have a bend, and bend compensation is provided, as shown in FIGS. 3-7 and described herein.

Curve 440 represents a printed circuit board where two parallel conductive traces have no bend, so as to indicate a minimum level of mode conversion.

As shown in FIG. 9, signal loss to mode conversion using bend compensation as described herein (curve 430) is reduced as compared with no compensation (curve 410) and with conventional mechanical length compensation (curve 420), at most frequencies up to 40 GHz.

Figure 10:
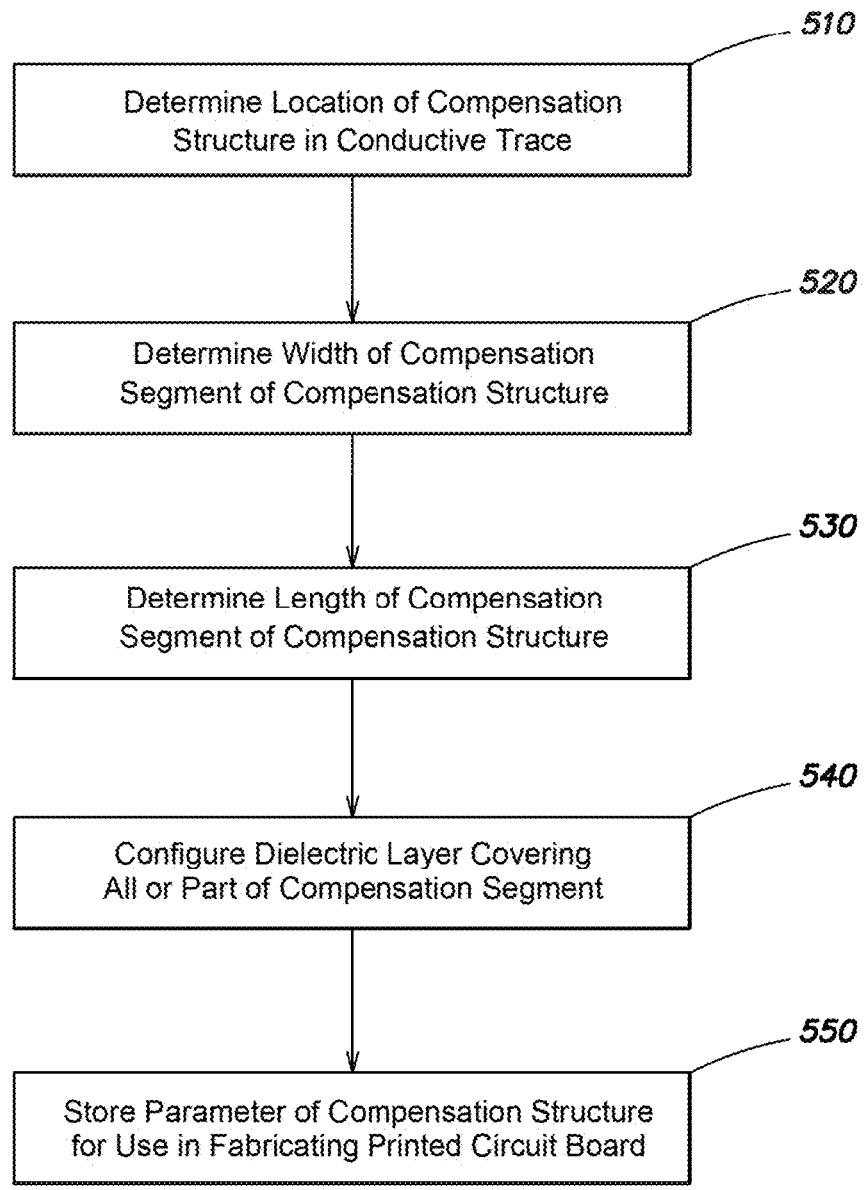
FIG. 10 is a flow diagram of a method for configuring compensation structures in differential signal traces on printed circuit boards, in accordance with embodiments.

A method for configuring compensation structures in differential signal traces on printed circuit boards in accordance with embodiments is shown in FIG. 10. The method may be performed by a printed circuit board designer using simulation software, such as for example HFSS. It will be understood that the method may include additional acts not shown in FIG. 10 and that the acts shown in FIG. 10 may be performed in a different order from that shown. The method is described with reference to the compensation structure 40 shown in FIG. 4 and described above. It will be understood that the method described herein is not limited to the compensation structure 40 shown in FIG. 4 and may be applied generally to the compensation structures described herein.

In act 510, a location of compensation structure 40 in conductive trace 32 is determined. The location of bend 38 in conductive traces 32 and 34 is identified. The compensation structure is typically located near the bend and in some cases, compensation structures can be located on opposite sides of the bend, as shown in FIG. 3. However, as noted above, the compensation structure is not required to be located at or near the bend.

In act 520, the width W1 of the compensation segment 50 of the compensation structure 40 is determined. The width W1 of the compensation segment 50 is determined so that the two conductive traces 32 and 34 of the differential signal pair have the same electrical lengths at the operating frequency of a particular application. The width W1 of the compensation segment 50 may be determined by selecting a width, determining the electrical lengths of the conductive traces with the simulation software and adjusting the width W1 as necessary to obtain equal electrical lengths.

In act 530, the length L1 of the compensation segment 50 of the compensation structure 40 is determined. The length L1 of the compensation segment 50 is selected to limit and preferably to minimize mode conversion that results from the bend 38 in the conductive traces 32 and 34. A suitable length can be selected by adjusting the length of the compensation segment 50 and determining mode conversion for the adjusted length. The process is repeated until an acceptable level of mode conversion is achieved.

In act 540, the dielectric layer 52 of the compensation structure 40 is configured. As noted above, the dielectric layer 52 may cover all or a part of the compensation segment 50 and may be a soldermask layer. The dielectric layer 52 affects the impedance of the differential signal pair and is configured, using the simulation software, to achieve a desired impedance.

After the compensation structure is configured as described above, the electrical performance of the differential signal pair can be evaluated using the simulation software. If necessary, some or all of acts 510-540 can be repeated until a desired performance is achieved.

After an acceptable configuration of the compensation structure is achieved, the parameters of the compensation structure can be stored for use in fabricating a printed circuit board in act 550. It will be understood that different compensation structure parameters will be used for different configurations of the differential signal pair, such as for different line widths and different spacings, for different bends in the differential signal pair and for different operating frequencies. Furthermore, the same compensation structure parameters can be used in different locations on one or more printed circuit boards where the parameters of the differential signal pair are the same or similar.

In some cases, it may be desirable to store a library of compensation structure configurations for different configurations of the differential signal pair. The compensation structure can be selected from the library based, for example, on the parameters of the first and second conductive traces, the operating frequency and the amount of bend in the first and second conductive traces.

Figure 11:
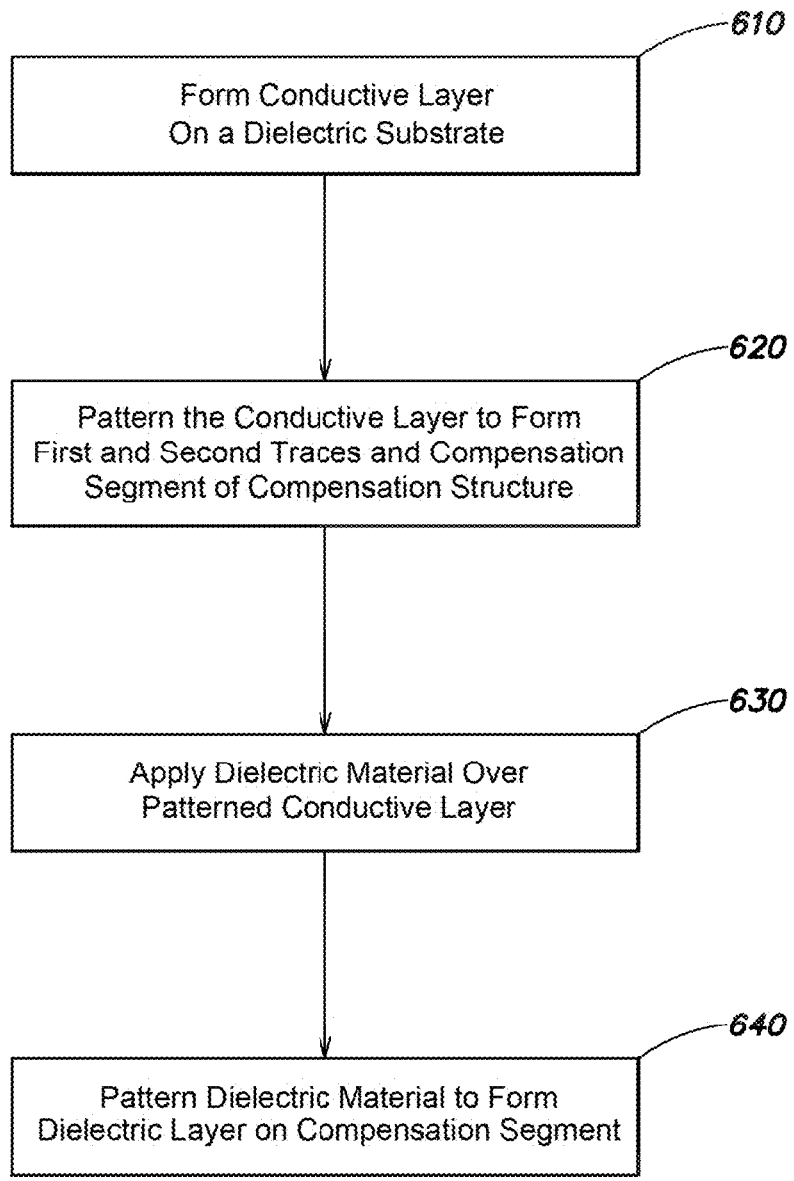
FIG. 11 is a flow diagram of a method for fabricating a printed circuit board, in accordance with embodiments.

A flow diagram of a method for fabricating a printed circuit board in accordance with embodiments is shown in FIG. 11. The printed circuit board includes one or more compensation structures as described herein. It will be understood that the method for fabricating the printed circuit board may include additional acts not shown in FIG. 11 and that the acts shown in FIG. 11 may be performed in a different order from that shown.

In act 610, the process starts with a dielectric substrate as conventionally used or developed hereafter for fabricating a printed circuit board. The size, thickness and material of the dielectric substrate is selected for a particular application. In act 610, a conductive layer is formed on the dielectric substrate. The conductive layer may be a material, such as copper, used for signal traces on a printed circuit board. The thickness of the copper layer is selected for a particular application.

In act 620, the conductive layer is patterned to form the desired conductive traces on the dielectric substrate. With reference to FIG. 4, the conductive layer is patterned to form the first and second conductive traces 32 and 34 of the differential signal pair and the compensation segment 50 of the compensation structure 40, as well as the connecting segments 56 and 58 between the conductive trace 32 and the compensation segment 50. The conductive layer may be patterned using conventional lithographic techniques. The patterning process incorporates the parameters of the conductive traces 32 and 34, the compensation segment 50 and the connecting segments 56 and 58. It will be understood that a typical printed circuit board may have multiple differential signal traces and multiple compensation structures.

In act 630, a dielectric material is applied to the printed circuit board over the patterned conductive layer. The dielectric material may cover the entire printed circuit board. In some embodiments, the dielectric material may be a soldermask layer.

In act 640, the dielectric material is patterned to form the dielectric layer 52 on the compensation segment 50 of the compensation structure. As noted above, the dielectric layer may cover all or part of the compensation segment. The dielectric material may be patterned to form a dielectric layer over other structures on the printed circuit board, as is conventional with the use of soldermask. The dielectric material may be patterned using conventional lithographic techniques.

Figure 12:
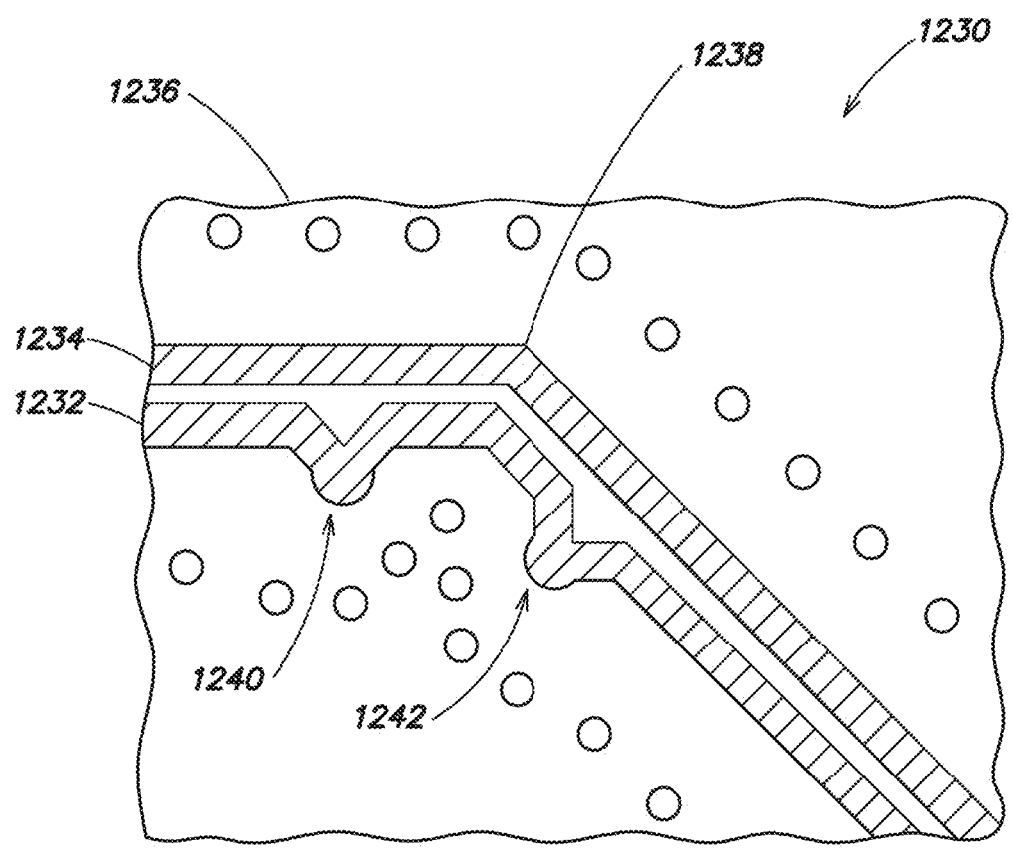
FIG. 12 is a top view of a printed circuit board having differential signal traces with compensation structures, in accordance with embodiments.
Figure 13:
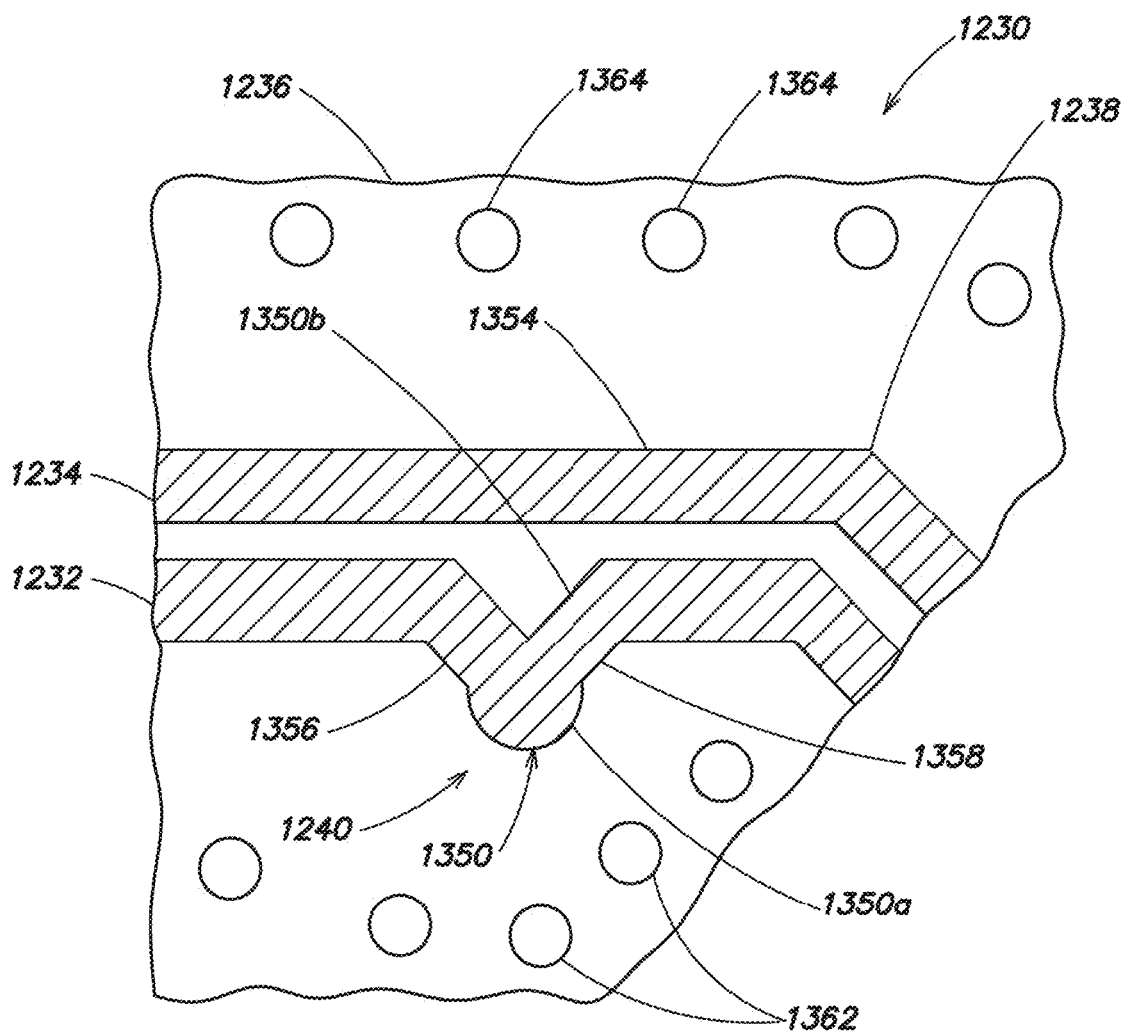
FIG. 13 is an enlarged top view of the printed circuit board of FIG. 12 showing a detail of a compensation structure, in accordance with embodiments.

A printed circuit board 1230 in accordance with further embodiments is shown in FIGS. 12 and 13. The printed circuit board 1230 includes a first conductive trace 1232 and a second conductive trace 1234 formed on a surface of a dielectric substrate 1236. The first and second conductive traces 1232 and 1234 may be a metal, such as copper. In some embodiments, the first and second conductive traces 1232 and 1234 have equal widths and equal thicknesses and are separated by a spacing equal to the width of one of the traces. However, these are not requirements and the widths, thicknesses and spacing may be different. The first and second conductive traces 1232 and 1234 are connected at opposite ends to electrical components (see FIG. 7) mounted on the printed circuit board. The first and second conductive traces 1232 and 1234 form a transmission line for carrying differential signals between the electrical components.

The printed circuit board may include a single dielectric substrate with conductive traces formed thereon or may include two or more substrates, each having conductive traces and/or ground planes formed thereon. The two or more substrates and associated conductive layers are pressed together to form the printed circuit board.

The first and second conductive traces 1232 and 1234 each include a bend 1238 which may be required by design constraints of the printed circuit board 1230. The bend 1238 may be an abrupt change of direction, as shown in FIG. 12, or may be a curve of any shape that causes a deviation from straight conductive traces. Furthermore, the first and second conductive traces 1232 and 1234 may include any number of bends, and the bends may be in the same or different directions and may have the same or different angles.

The printed circuit board 1230 further includes at least one compensation structure. The embodiment of FIG. 12 includes a compensation structure 1240 and a compensation structure 1242. Each of the compensation structures 1240 and 1242 is connected in line with, that is electrically in series with, the first conductive trace 1232. Compensation structure 1240 has opposite ends connected to first conductive trace 1232, and compensation structure 1242 has opposite ends connected to first conductive trace 1232 to form a continuous electrical path from first conductive trace 1232 through compensation structures 1240 and 1242. In the embodiment of FIG. 12, the first conductive trace 1232 is mechanically shorter than the second conductive trace 1234, in the absence of compensation structures 1240 and 1242, as a result of bend 1238.

In the embodiment of FIG. 12, the compensation structures 1240 and 1242 are located close to bend 1238 and are located on opposite sides of bend 1238. However, this is not a requirement. The printed circuit board 1230 may include a single compensation structure in first conductive trace 1232 or may include more than two compensation structures in conductive trace 1232. The compensation structures may be located at or near bend 1238, but this is not a requirement. In particular, the compensation structures may be located at any point along the length of the first conductive trace 1232. Furthermore, the printed circuit board may include compensation structures in the first conductive trace 1232 and/or the second conductive trace 1234 in any number required to achieve a desired electrical performance. For example, one or more compensation structures may be provided for each bend in the first and second conductive traces 1232 and 1234. The compensation structures may have the same or different mechanical and electrical parameters depending on the required compensation at a particular location along the conductive traces.

An enlarged schematic diagram of printed circuit board 1230 including compensation structure 1240 in accordance with embodiments is shown in FIG. 13. FIG. 13 is a top view of printed circuit board 1230 including compensation structure 1240.

The compensation structure 1240 is connected in line with first conductive trace 1232 and in particular is electrically connected in series with first conductive trace 1232 to form a continuous electrical path including first conductive trace 1232 and compensation structure 1240. The compensation structure 1240 includes a compensation segment 1350 and connecting segments 1356 and 1358. The compensation segment 1350 is formed of conductive material and is typically formed of the same material as the first and second conductive traces 1232 and 1234. In the embodiment of FIGS. 12 and 13, the dielectric substrate 1236 performs the function of the dielectric layer in the previously described embodiments.

The embodiment of FIGS. 12 and 13 may further include first circular conductive areas 1362 adjacent to first conductive trace 1232 and second circular conductive areas 1364 adjacent to second conductive trace 1234. The first circular conductive areas 1362 may be connected to first conductive trace 1232, and the second circular conductive areas 1364 may be connected to second conductive trace 1234, by respective conductive traces (not shown). The first and second circular conductive areas 1362 and 1364 are provided for impedance tuning. The compensation segment 1350 tunes electrical length, but also creates impedance mismatch. The first and second circular conductive areas 1362 and 1364 adjust the impedance to the target impedance but have a minimal effect on electrical length.

As shown in FIG. 13, the compensation segment 1350 may include a curved portion 1350a on one side and a V-shaped portion 1350b on an opposite side. In embodiments, the curved portion 1350a may be circular in shape and may have a radius of curvature that is larger than half the width of conductive trace 1232. In some embodiments, the radius of curvature of circular portion 1350a is in a range of 2 to 12 mils. As used herein, the term "circular portion" refers to a shape that is a portion of a circle, as in the example of FIG. 13. Furthermore, compensation segment 1350 is not necessarily circular in shape and, for example, can be elliptical or another curved shape. The circular portion 1350a in the example of FIG. 13 is approximately semi-circular. The size and shape of the compensation structure 1350 are selected to provide a desired impedance at the operating frequency of the printed circuit board.

The compensation structure 1240 includes connecting segment 1356 that connects one end of compensation segment 1350 to first conductive trace 1232 and connecting segment 1358 that connects an opposite end of compensation segment 1350 to first conductive trace 1232 to form a continuous electrical path from first conductive trace 1232 through compensation segment 1350. The connecting segments 1356 and 1358 may have the same width as first conductive trace 1232 or may be tapered from the width of first conductive trace 1232 to the dimension of compensation segment 1350. The connecting segments 1356 and 1358 can have any desired shape, but preferably avoid abrupt changes, such as right angles, which may adversely affect the high frequency transmission characteristics of the transmission line formed by first conductive trace 1232 and second conductive trace 1234.

The compensation segment 1350 and the connecting segments 1356 and 1358 form a so-called "jogout" structure in first conductive trace 1232. The jogout structure effectively increases the mechanical length of the first conductive trace 1232. In accordance with embodiments, the jogout structure formed by compensation segment 1350 and connecting segments 1356 and 1358 may produce a mismatch in mechanical length between first conductive trace 1232 and second conductive trace 1234, rather than equalizing the mechanical lengths. The mismatch in mechanical lengths may be offset by the size and shape of compensation segment 1350 and by the dielectric layer that covers compensation segment 1350.

A corresponding segment 1354 of second conductive trace 1234 is located opposite compensation structure 1240. In the embodiment of FIGS. 12 and 13, the corresponding segment 1354 has the same width as the remainder of second conductive trace 1234 and is not covered with a dielectric layer. In other embodiments, the corresponding segment 1354 may have a different width from the second conductive trace 1234 and may be covered by a dielectric layer, in effect providing a compensation structure in second conductive trace 1234. In such embodiments, the compensation structure in second conductive trace 1354 may have different parameters from the compensation structure 1240 to achieve a desired performance.

The printed circuit board thus includes one or more compensation structures as described herein. The compensation structures include compensation segments which may be formed of the same material as the differential signal traces and dielectric layers which may be formed of the same material as the soldermask layers. Thus, additional processing steps are not required.

Having thus described several aspects of at least one embodiment, it is to be appreciated that various alterations, modifications, and improvements will readily occur to those skilled in the art.

Such alterations, modifications, and improvements are intended to be part of this disclosure and are intended to be within the spirit and scope of the present disclosure. Further, though advantages described in the present disclosure are indicated, it should be appreciated that not every embodiment of the present disclosure will include every described advantage. Some embodiments may not implement any features described as advantageous herein and in some instances. Accordingly, the foregoing description and drawings are by way of example only.

Various aspects of the present disclosure may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, aspects of the present disclosure may be embodied as one or more methods, of which method 500 has been provided as an example. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "including" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

Also, the phraseology and terminology used herein is for the purpose of description and should not be regarded as limiting. The use of "including," "having," "containing," "involving," and variations thereof herein, is meant to encompass the items listed thereafter and equivalents thereof as well as additional items.

What is claimed is:

1. A printed circuit board comprising:
    a dielectric substrate;
    first and second conductive traces disposed on the dielectric substrate; and
    a compensation structure disposed in the first conductive trace, the compensation structure including:
        a conductive compensation segment connected in line with the first conductive trace, the conductive compensation segment including a curved portion;
        a first straight connecting segment, between one end of the conductive compensation segment and the first conductive trace, that jogs away from the second conductive trace between the first conductive trace and the one end of the conductive compensation segment; and
        a second straight connecting segment, between the other end of the conductive compensation segment and the first conductive trace, that jogs toward the second conductive trace between the other end of the conductive compensation segment and the first conductive trace,
        wherein the curved portion extends continuously from the one end to the other end of the conductive compensation segment.

2. The printed circuit board as defined in claim 1, wherein the curved portion of the conductive compensation segment comprises a circular portion that extends continuously from the one end to the other end of the conductive compensation segment.

3. The printed circuit board as defined in claim 2, wherein a radius of curvature of the circular portion is larger than half a width of the first conductive trace.

4. The printed circuit board as defined in claim 2, wherein the conductive compensation segment includes a V-shaped portion opposite the curved portion.

5. The printed circuit board as defined in claim 1, wherein the compensation structure further comprises first and second circular conductive areas located adjacent to the first and second conductive traces, respectively.

6. The printed circuit board as defined in claim 1, wherein the first conductive trace further includes:
 a second compensation structure disposed in the first conductive trace, wherein the compensation structure is a first compensation structure, and the first compensation structure and the second compensation structure are spaced substantially equally from and located on opposite sides of a bend in the first conductive trace and in the second conductive trace, the second compensation structure including:
  a second conductive compensation segment connected in line with the first conductive trace, the second conductive compensation segment including a second curved portion;
  a third straight connecting segment, between one end of the second conductive compensation segment and the first conductive trace, that jogs away from the second conductive trace between the first conductive trace and the one end of the second conductive compensation segment; and
  a fourth straight connecting segment, between the other end of the second conductive compensation segment and the first conductive trace, that jogs toward the second conductive trace between the other end of the second conductive compensation segment and the first conductive trace,
  wherein the second curved portion extends continuously from the one end to the other end of the second conductive compensation segment.

7. A system comprising:
 a printed circuit board comprising:
  a dielectric substrate;
  first and second conductive traces disposed on the dielectric substrate; and
  a compensation structure disposed in the first conductive trace, the compensation structure including:
   a conductive compensation segment connected in line with the first conductive trace, the conductive compensation segment including a curved portion;
   a first straight connecting segment, between one end of the conductive compensation segment and the first conductive trace, that jogs away from the second conductive trace between the first conductive trace and the one end of the conductive compensation segment; and
   a second straight connecting segment, between the other end of the conductive compensation segment and the first conductive trace, that jogs toward the second conductive trace between the other end of the conductive compensation segment and the first conductive trace,
   wherein the curved portion extends continuously from the one end to the other end of the conductive compensation segment;
 a first electrical component mounted on the printed circuit board; and
 a second electrical component mounted on the printed circuit board, the first and second conductive traces routed from the first electrical component to the second electrical component.

8. The system as defined in claim 7, wherein the curved portion of the conductive compensation segment comprises a circular portion.

9. The system as defined in claim 8, wherein a radius of curvature of the circular portion is larger than half a width of the first conductive trace.

10. The system as defined in claim 8, wherein the conductive compensation segment includes a V-shaped portion opposite the curved portion.

11. The system as defined in claim 7, wherein the compensation structure further comprises first and second circular conductive areas located adjacent to the first and second conductive traces, respectively.

12. The system as defined in claim 7, wherein the first electrical component is an integrated circuit or an electrical connector, and the second electrical component is an integrated circuit or an electrical connector.

13. The system as defined in claim 12, wherein the first and second conductive traces are configured to carry differential signals between the first electrical component and the second electrical component.

14. The system as defined in claim 7, wherein the first conductive trace further includes:
 a second compensation structure disposed in the first conductive trace, wherein the compensation structure is a first compensation structure, and the first compensation structure and the second compensation structure are spaced substantially equally from and located on opposite sides of a bend in the first conductive trace and in the second conductive trace, the second compensation structure including:
  a second conductive compensation segment connected in line with the first conductive trace, the second conductive compensation segment including a second curved portion;
  a third straight connecting segment, between one end of the second conductive compensation segment and the first conductive trace, that jogs away from the second conductive trace between the first conductive trace and the one end of the second conductive compensation segment; and
  a fourth straight connecting segment, between the other end of the second conductive compensation segment and the first conductive trace, that jogs toward the second conductive trace between the other end of the second conductive compensation segment and the first conductive trace,
  wherein the second curved portion extends continuously from the one end to the other end of the second conductive compensation segment.

15. A method for fabricating a printed circuit board, comprising:
 forming conductive layer on a dielectric substrate; and
 patterning the conductive layer to form first and second conductive traces on the dielectric substrate, the first conductive trace including a compensation structure, the compensation structure including:

a conductive compensation segment connected in line with the first conductive trace and including a curved portion;

a first straight connecting segment, between one end of the conductive compensation segment and the first conductive trace, that jogs away from the second conductive trace between the first conductive trace and the one end of the conductive compensation segment; and a second straight connecting segment, between the other end of the conductive compensation segment and the first conductive trace, that jogs toward the second conductive trace between the other end of the conductive compensation segment and the first conductive trace, wherein the curved portion extends continuously from the one end to the other end of the conductive compensation segment.

16. The method as defined in claim 15, wherein the curved portion of the conductive compensation segment comprises a circular portion.

17. The method as defined in claim 16, wherein a radius of curvature of the circular portion is larger than half a width of the first conductive trace.

18. The method as defined in claim 16, wherein the conductive compensation segment includes a V-shaped portion opposite the curved portion.

19. The method as defined in claim 15, wherein the compensation structure further comprises first and second circular conductive areas located adjacent to the first and second conductive traces, respectively.

20. The method as defined in claim 15, wherein the first conductive trace further includes:

a second compensation structure disposed in the first conductive trace, wherein the compensation structure is a first compensation structure, and the first compensation structure and the second compensation structure are spaced substantially equally from and located on opposite sides of a bend in the first conductive trace and in the second conductive trace, the second compensation structure including:

a second conductive compensation segment connected in line with the first conductive trace, the second conductive compensation segment including a second curved portion;

a third straight connecting segment, between one end of the second conductive compensation segment and the first conductive trace, that jogs away from the second conductive trace between the first conductive trace and the one end of the second conductive compensation segment; and a fourth straight connecting segment, between the other end of the second conductive compensation segment and the first conductive trace, that jogs toward the second conductive trace between the other end of the second conductive compensation segment and the first conductive trace, wherein the second curved portion extends continuously from the one end to the other end of the second conductive compensation segment.

* * * * *